(12) United States Patent
Mizumura

(10) Patent No.: US 10,337,096 B2
(45) Date of Patent: Jul. 2, 2019

(54) METHOD FOR MANUFACTURING DEPOSITION MASK AND DEPOSITION MASK

(71) Applicant: V TECHNOLOGY CO., LTD., Yokohama-shi (JP)

(72) Inventor: Michinobu Mizumura, Yokohama (JP)

(73) Assignee: V TECHNOLOGY CO., LTD., Yokohama-shi (JP)

( * ) Notice: Subject to any disclaimer, the term of this patent is extended or adjusted under 35 U.S.C. 154(b) by 408 days.

(21) Appl. No.: 15/179,829

(22) Filed: Jun. 10, 2016

(65) Prior Publication Data

US 2016/0281209 A1 Sep. 29, 2016

Related U.S. Application Data

(63) Continuation of application No. PCT/JP2014/082121, filed on Dec. 4, 2014.

(30) Foreign Application Priority Data

Dec. 20, 2013 (JP) .................................. 2013-264326

(51) Int. Cl.
  *C23C 14/04* (2006.01)
  *B23K 26/066* (2014.01)
  (Continued)

(52) U.S. Cl.
  CPC .......... *C23C 14/042* (2013.01); *B23K 26/066* (2015.10); *B23K 26/073* (2013.01);
  (Continued)

(58) Field of Classification Search
  CPC ....... C23C 14/042; C23C 14/50; C23C 14/24; C23C 16/042; B23K 26/066; B23K 26/073
  See application file for complete search history.

(56) References Cited

U.S. PATENT DOCUMENTS 5,651,784 A * 7/1997 Klopotek ............ A61F 9/00804
   128/898
2004/0043606 A1* 3/2004 Crowder ............. H01L 21/2026
   438/662

(Continued)

FOREIGN PATENT DOCUMENTS

JP 2009-249706 A 10/2009
JP 2010-188418 A 9/2010

(Continued)

OTHER PUBLICATIONS

Japanese Office Action from Japanese Patent Application No. 2013-264326, dated Dec. 5, 2017, 11 pages.

(Continued)

*Primary Examiner* — Jeffrie R Lund
(74) *Attorney, Agent, or Firm* — Morgan, Lewis & Bockius LLP

(57) ABSTRACT

The present invention provides a method for manufacturing a deposition mask, which irradiates laser light L to a resin film 20 to form an opening pattern 4 having a polygonal shape in a plan view, the method including a step of irradiating the laser light L that is shaped using a beam-shaping mask 10 having a light transmissive window 18 that allows the laser light L to pass therethrough with light transmittance gradually reducing with distance from an edge of the light transmissive window 18 on at least one of opposing sides thereof within an area outside the light transmissive window 18 to thereby form the opening pattern 4 having at least one pair of opposing side walls 4a that are inclined to open wide toward a surface of the film 20 to be irradiated with the laser light L, from a surface opposite to the irradiated surface.

5 Claims, 8 Drawing Sheets

(51) Int. Cl.
*B23K 26/073* (2006.01)
*C23C 14/50* (2006.01)
*C23C 14/24* (2006.01)
*C23C 16/04* (2006.01)

(52) U.S. Cl.
CPC .............. *C23C 14/24* (2013.01); *C23C 14/50* (2013.01); *C23C 16/042* (2013.01)

(56) References Cited

U.S. PATENT DOCUMENTS

| | | | |
|---|---|---|---|
| 2013/0186330 A1 | 7/2013 | Lee et al. | |
| 2014/0199808 A1 | 7/2014 | Sugimoto et al. | |
| 2016/0281209 A1* | 9/2016 | Mizumura | B23K 26/066 |
| 2017/0244036 A1* | 8/2017 | Okawara | H01L 51/56 |

FOREIGN PATENT DOCUMENTS

| | | |
|---|---|---|
| JP | 2012-035294 A | 2/2012 |
| JP | 2013-108143 A | 6/2013 |
| JP | 2013-147739 A | 8/2013 |
| JP | 2013-165058 A | 8/2013 |
| JP | 2013-165060 A | 8/2013 |
| WO | WO-2013/105642 A1 | 7/2013 |

OTHER PUBLICATIONS

Chinese Office Action from in Chinese Patent Application No. 201480069390.6 dated Feb. 14, 2018, 10 pages.
International Preliminary Report on Patentability dated Jun. 30, 2016, and English language translation.
Taiwanese Office Action from Taiwanese Patent Application No. 103144224, dated Jun. 26, 2018, 21 pages.

\* cited by examiner

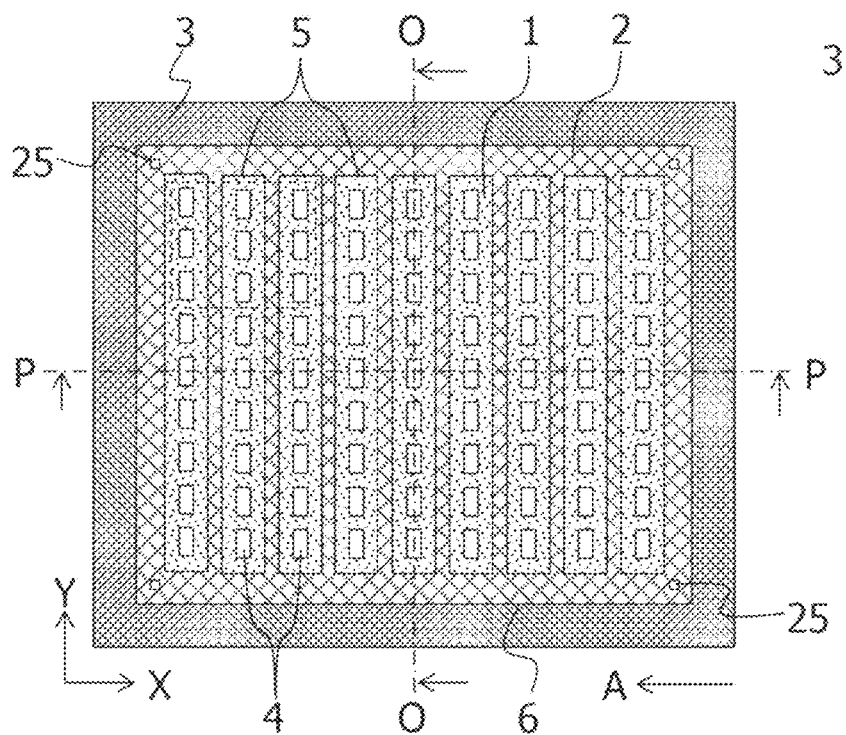
FIG.1A
FIG.1B
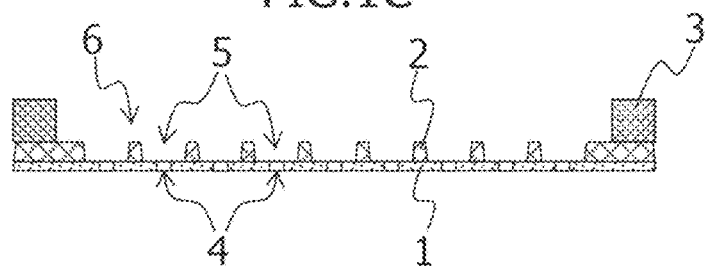
FIG.1C

FIG.3A
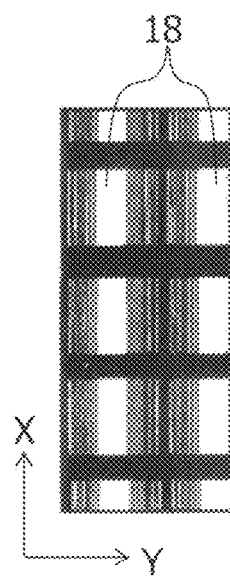
FIG.3B
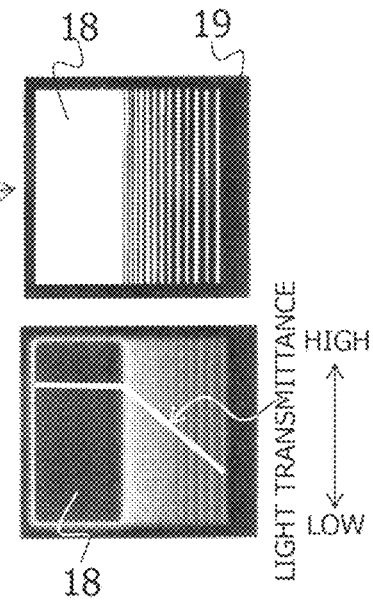
FIG.3C
FIG.3D
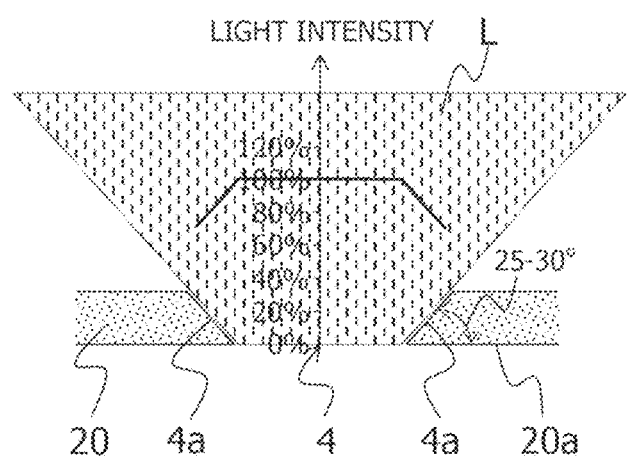

METHOD FOR MANUFACTURING DEPOSITION MASK AND DEPOSITION MASK

CROSS-REFERENCE TO RELATED APPLICATION

This application is a continuation application of PCT/JP2014/082121, filed on Dec. 4, 2014.

BACKGROUND OF THE INVENTION

1. Field of the Invention

The present invention relates to a method for manufacturing a deposition mask by irradiating a resin film with laser light to form an opening pattern, more particularly to a method for manufacturing a deposition mask so as to control the inclination angle of side walls of the opening pattern, and to a deposition mask manufactured by such method.

2. Description of Related Art

Conventional deposition masks include a mask layer having the thickness of 1 μm to 50 μm. The mask layer has at least one opening pattern corresponding to a deposition pattern. On the mask layer, a magnetic member is disposed not to cover the opening pattern of the mask layer (see JP 2009-249706 A, for example). The opening pattern of the mask layer is desirably tapered to open wide toward the surface facing the magnetic member.

In such conventional deposition masks, the opening pattern is formed, for example, by irradiating a film with laser light shaped in cross section substantially in conformity with the opening pattern. Thus, the inclination angle of side walls of the opening pattern cannot be easily controlled.

Especially if an opening pattern has a rectangular shape in a plan view with two pairs of opposing side walls, the inclination angle for one pair must be the same as that for the other. Accordingly, when deposition is carried out with a deposition mask manufactured by the conventional method while scanning a substrate in one direction, the resultant thin layer shows non-uniform distribution of layer thickness in the direction crossing the scanning direction because the edge of the opening pattern in this direction shadows the substrate.

SUMMARY OF THE INVENTION

To overcome the above problem, an object of the present invention is to provide a method for manufacturing a deposition mask so as to control the inclination angle of side walls of the opening pattern and a deposition mask manufactured by such method.

In order to achieve the above object, the present invention provides a method for manufacturing a deposition mask, in which laser light is irradiated to a resin film to form an opening pattern having a polygonal shape in a plan view, the method comprising a step of irradiating the laser light that is shaped using a beam-shaping mask having a light transmissive window that allows the laser light to pass therethrough with light transmittance reducing gradually with distance from an edge of the light transmissive window on at least one of opposing sides of the light transmissive window within an area outside the light transmissive window to thereby form an opening pattern having at least one pair of opposing side walls that are inclined to open wide toward a surface of the film to be irradiated with the laser light from a surface opposite to the irradiated surface.

The present invention provides a deposition mask that serves to form a deposition layer on a substrate through an opening pattern formed in a sheet-like substrate member, wherein the opening pattern has a plurality of pairs of opposing side walls that open wide toward a surface of the substrate member facing a deposition source from a surface opposite to the surface facing the deposition source and also incline at different angles at least at the surface facing the deposition source.

According to the present invention, it is possible to easily control the inclination angle of the opposing side walls of an opening pattern formed in a film by laser processing, the walls being inclined to open wide toward a surface to be irradiated with laser light. Accordingly, it is possible to easily manufacture a deposition mask having plural pairs of opposing side walls of an opening pattern, which open wide toward the deposition source and incline at different angles at least at the surface facing the deposition source. Therefore, the side walls of the opening pattern are less likely to shadow a substrate upon deposition and hence, a thin deposition layer can be formed with uniform layer thickness.

BRIEF DESCRIPTION OF THE DRAWINGS

FIGS. 1A to 1C show a deposition mask according to an embodiment of the present invention, in which FIG. 1A is a plan view thereof, FIG. 1B is a sectional view taken along line O-O of FIG. 1A, and FIG. 1C is a sectional view taken along line P-P of FIG. 1A.

FIGS. 3A to 3D show a configuration example of a beam-shaping mask used in the laser processing device, in which FIG. 3A is a plan view thereof, FIG. 3B is a partially enlarged plan view of FIG. 3A, FIG. 3C is an explanatory view of light transmittance in an area shown in FIG. 3B, and FIG. 3D is an explanatory sectional view showing the inclination angle of the opposing side walls in an opening pattern formed by laser light passed through a light transmissive window shown in FIG. 3A.

FIGS. 4A and 4B show a configuration example of a conventional beam-shaping mask, in which FIG. 4A is a plan view thereof and FIG. 4B is an explanatory sectional view showing the inclination angle of opposing side walls of an opening pattern formed by laser light passed through a light transmissive window shown in FIG. 4A.

FIGS. 5A and 5B are explanatory views for vapor-deposition with a conventional metal mask, in which FIG. 5A shows thickness distribution of a vapor-deposition layer in the relative scan direction of a vapor-deposition source and FIG. 5B shows thickness distribution of the vapor-deposition layer in the direction crossing the relative scan direction of the vapor-deposition source.

FIGS. 6A and 6B are explanatory views for vapor-deposition with a deposition mask having an opening pattern formed by laser processing using the beam-shaping mask shown in FIGS. 4A and 4B, in which FIG. 6A shows thickness distribution of an vapor-deposition layer in the relative scan direction of an vapor-deposition source and FIG. 6B shows thickness distribution of the vapor-deposition layer in the direction crossing the relative scan direction of the vapor-deposition source.

FIGS. 7A and 7B are explanatory views for vapor-deposition with a deposition mask according to the present invention, in which FIG. 7A shows thickness distribution of a vapor-deposition layer in the relative scan direction of a vapor-deposition source and FIG. 7B shows thickness distribution of the vapor-deposition layer in the direction crossing the relative scan direction of the vapor-deposition source.

DESCRIPTION OF PREFERRED EMBODIMENTS

Figure 2:
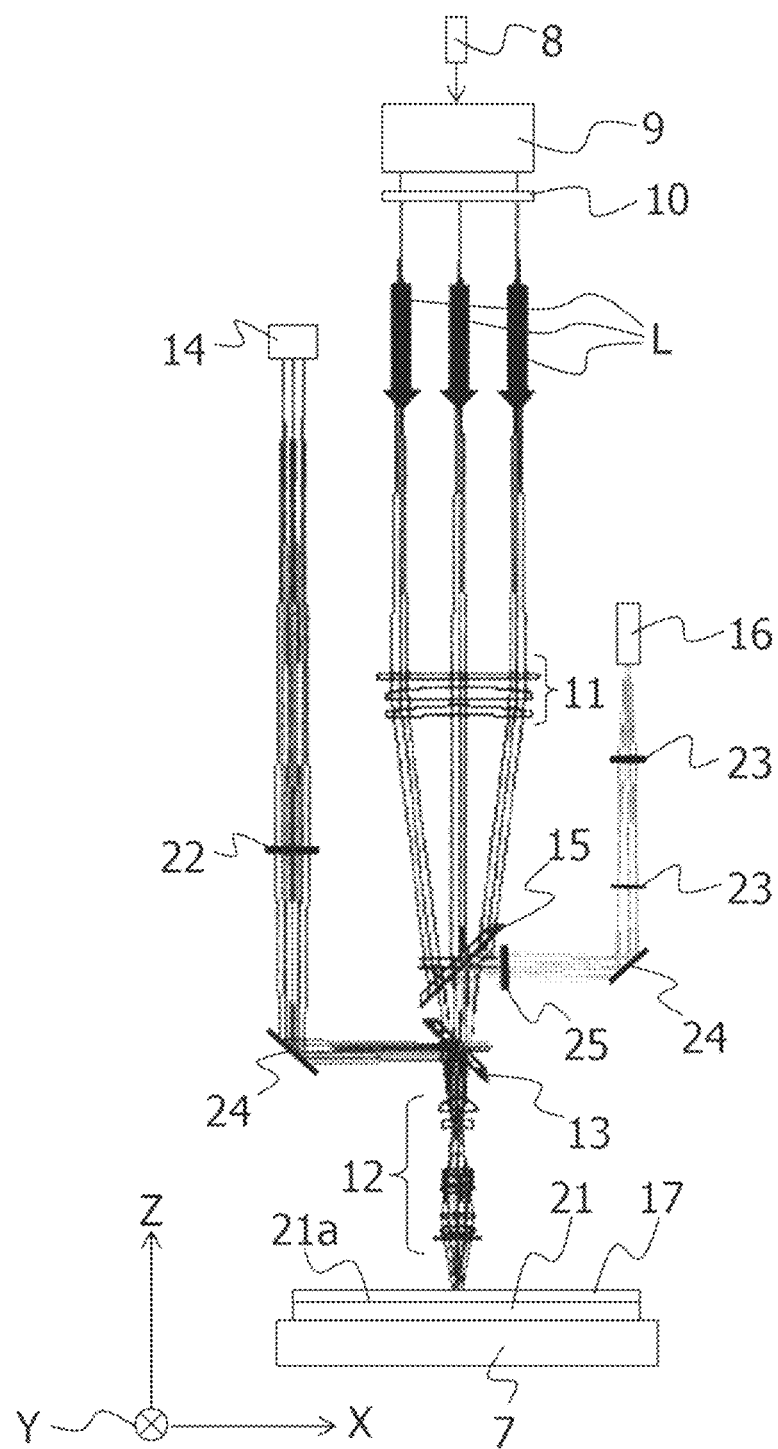
FIG. 2 is a front view showing a configuration example of a laser processing device for forming an opening pattern in a deposition mask according to the present invention.

Hereinafter, embodiments of the present invention will be described in detail with reference to the accompanying drawings. FIGS. 1A to 1C show a deposition mask according to an embodiment of the present invention, in which FIG. 1A is a plan view thereof, FIG. 1B is a sectional view taken along line O-O of FIG. 1A, and FIG. 1C is a sectional view taken along line P-P of FIG. 1A. The deposition mask serves to form a deposition layer on a substrate through an opening pattern. The mask includes a film mask 1, a metal mask 2, and a metal frame 3.

The film mask 1 is used in close contact with the deposition substrate. The mask functions as a main mask for forming a thin layer pattern on the deposition substrate. A film applicable to the mask is, for example, a resin film made of polyimide, polyethylene terephthalate (PET), or the like with the thickness of about 10 μm to 30 μm. The film has plural opening patterns 4 of a polygonal shape (rectangle in this embodiment) in a plan view formed in matrix in conformity with the thin layer pattern as shown in FIG. 1A. In this case, preferred is polyimide having the linear coefficient of expansion of about $3 \times 10^{-6}$ to $5 \times 10^{-6}$/° C., which value approximates that of glass as the deposition substrate (hereinafter simply referred to as "substrate").

To be specific, the opening pattern 4 has plural pairs (two pairs, for example) of opposing side walls inclined to open wide from the substrate toward a deposition source (metal mask 2). The plural pairs of opposing side walls incline at different angles at least on the deposition source (metal mask 2) side as shown in FIGS. 1B and 1C.

More specifically, if the deposition mask according to the present invention is applied to a deposition device that forms a deposition layer while scanning a substrate in one direction, the following is desirable. That is, a larger inclination angle is set for one pair of opposing side walls in a direction (Y-axis direction) crossing the substrate scanning direction (direction indicated by arrow A in FIG. 1A (identical to the X-axis direction)) compared to the other pair of opposing side walls.

The metal mask 2 is laminated on one surface of the film. The metal mask 2 is a sheet made of a magnetic metal material such as nickel, nickel alloy, invar, or invar alloy, for example, with the thickness of about 30 μm to 50 μm. The mask 2 has through holes 5 capable of accommodating the opening patterns 4 and serves as a sub mask for supporting the film mask 1.

To be specific, as shown in FIG. 1A, the slit-like through holes 5 are arranged in rows in the form of accommodating the aligned plural opening patterns 4. If the deposition mask according to the present invention is applied to a deposition device that forms a deposition layer while scanning a substrate in one direction, the slit-like through holes 5 are arranged with its longitudinal direction crossing the substrate scanning direction (direction indicated by arrow A).

In this case, the deposition mask is provided on the substrate with the metal mask 2 facing the deposition source.

The metal mask 2 is attracted to a magnet embedded in a substrate holder to thereby bring the film mask 1 into close contact onto the deposition surface of the substrate.

The metal frame 3 is provided on the other side of the metal mask 2 opposite to the film mask 1. The metal frame 3 holds and supports the circumference of the metal mask 2. The metal frame 3 is made of, for example, a magnetic metal material such as invar or invar alloy. The metal frame 3 has an opening 6 capable of accommodating the plural rows of through holes 5 in the metal mask 2. Note that the frame is not limited to the metal frame 3 and could be formed of a hard resin instead. In this embodiment, the metal frame 3 is employed.

Described next is a method for manufacturing the aforementioned deposition mask. First of all, a metal sheet of a predetermined size is cut from a sheet made of a magnetic metal material such as invar or invar alloy with the thickness of about 30 μm to 50 μm, for example, according to the substrate size.

Subsequently, a polyimide resin solution is, for example, applied onto one side of the metal sheet and the resultant sheet is cured at about 200° C. to 300° C. to form a film having the thickness of about 10 μm to 30 μm. The film may either allow or disallow visible light to pass therethrough without any particular limitation. In this case, the film allows visible light to pass therethrough.

Next, a photoresist is sprayed, for example, onto the other side of the metal sheet and then dried to obtain a resist film. After that, the resist film is exposed to light using a photo mask and then developed to form a resist mask having slit-like openings in plural rows in conformity with areas assigned to the plural rows of through holes 5.

Subsequently, the metal sheet undergoes wet etching using the resist mask. Some areas of the metal sheet corresponding to each opening of the resist mask are removed to thereby form the slit-like through holes 5 in plural rows and thus obtain the metal mask 2. After that, the resist mask is dissolved into, for example, an organic solvent and removed. As a result, produced is a mask member having the laminate of the metal mask 2 and the resin film. Note that an etchant for etching the metal sheet can be appropriately chosen according to a material for the metal sheet based on any well-known technique.

Concurrently with etching the metal sheet to form the through holes 5, through holes 25 as shown in FIG. 1A may be formed. The through holes serve as alignment marks on the mask side. The alignment marks will be aligned with those formed in advance on the substrate at predetermined positions outside of areas assigned to the plural rows of through holes 5. In this case, openings for the alignment marks may be formed in conformity with the through holes 25 at the time of forming the resist mask.

The mask member can be formed by the other method as described below instead of the above method. For example, a seed layer is formed on one side of the film, for example, by non-electroplating and then a photoresist is applied thereonto. The resultant is exposed and developed to form island patterns in plural rows in conformity with areas assigned to the plural rows of through holes 5. After that, a magnetic metal material such as nickel, nickel alloy, invar, or invar alloy is plated outside the island patterns. After the removal of the island patterns, the seed layer corresponding to the island patterns is etched off to thereby form a mask member.

Next, the mask member is stretched over one end surface of the metal frame 3 with the metal mask 2 facing the metal frame 3, and then held thereto. The mask member may be fixed to the metal frame 3 by spot welding. That is, laser light is applied to the circumference of the mask member from the film mask 1 side to thereby bond the metal mask 2 and the metal frame 3.

Subsequently, the processing advances to the step of forming opening patterns, which constitutes the technical feature of the present invention. The step of forming opening patterns is to apply laser light L from the metal mask 2 side to form plural opening patterns 4 in lines on the film within the plural rows of through holes 5 of the metal mask 2.

Referring to FIG. 2, a laser processing device used for the step of forming the opening patterns is described first. The laser processing device includes an XY stage 7 and, components of a laser light source 8, a coupling optical system 9, a beam-shaping mask 10, an imaging lens 11, and an objective lens 12. These components are arranged above the XY stage 7 in this order from the upstream to downstream in the direction in which the laser light L travels. Further, the image pickup camera 14 is provided on the optical path from the objective lens 12 to the imaging lens 11, which is split by the half mirror 13. The illumination light source 16 is provided on the optical path from the objective lens 12 to the imaging lens 11, which is split by the dichroic mirror 15 that allows the laser light L having the wavelength of 400 nm or less to pass therethrough but reflects visible light.

Here, the XY stage 7 moves along an XY direction within a plane parallel to an XY plane with a mask member 17 being mounted thereon, and under the control of a control apparatus (not shown), moves stepwise according to a previously input and memorized value.

The laser light source 8 is, for example, KrF excimer laser (248 nm) for emitting the laser light L with the wavelength of 400 nm or less or YAG laser for emitting the laser light L converted to third or fourth harmonics with the wavelength of 1064 nm.

The coupling optical system 9 includes a beam expander for expanding laser beam radiated from the laser light source 8, and a photointegrator and a condenser lens both used to homogenize the illuminance distribution of the laser light L and irradiate the resultant light to the beam-shaping mask 10 as described below.

The beam-shaping mask 10 serves to shape the laser light L to be irradiated to the mask member 17 to obtain a laser beam having a sectional shape similar to a target opening pattern 4 and then, emit the thus-shaped laser beam. The mask 10 includes plural light transmissive windows 18 having a sectional shape similar to the opening pattern 4. The plural light transmissive windows 18 are formed at a predetermined rate of magnification in conformity with the plural opening patterns 4 in the predetermined unit area framed by the dashed line in FIG. 1A according to the alignment pitch thereof. The light transmissive window 18 is formed on a light shielding film made of chromium (Cr) or the like and deposited on a surface of a transparent glass substrate or a quartz substrate.

Further details of the mask structure are discussed next. The beam-shaping mask 10 has the light transmissive window 18 similar in shape to the opening pattern 4. Considering the light transmittance at outer areas of the light transmissive window 18 on at least one of opposing sides thereof, the light transmittance gradually reduces with distance from the edge of the light transmissive window 18.

More specifically, as shown in FIG. 3A, in the beam-shaping mask 10, light shielding portions and light transmissive portions alternate with each other from the edge of the light transmissive window 18 in the light shielding film 19 at the outer areas on opposing sides of the light transmissive window 18 in the Y-axis direction. In addition, as illustrated in a partially enlarged view of FIG. 3B, the width of the light shielding portion gradually increases with distance from the edge of the light transmissive window 18. As shown in FIG. 3C, the light transmittance shows graduation of distribution, which gradually reduces with distance from the edge of the light transmissive window 18 at the outer areas on opposing sides in the Y-axis direction (direction crossing the substrate scanning direction). Accordingly, as shown in FIG. 3D, the intensity of the laser light L irradiated to the film 20 marks the highest at the center of an area corresponding to the opening pattern 4 and then gradually reduces with distance from the edge of the opening pattern 4.

Here, the light transmittance can be gradually reduced at the outer areas on opposing sides of the light transmissive window 18 in a different manner such as halftoning a target area of the light shielding film 19 instead of forming the light shielding portion and the light transmissive portion in turn on the light shielding film 19.

The imaging lens 11 is a condenser lens for reducing images of the plural light transmissive windows 18 in the beam-shaping mask 10 at a predetermined rate and projecting the reduced images onto a film in corporation with the objective lens 12 as described later.

The objective lens 12 serves to project reduced images of the plural light transmissive windows 18 in the beam-shaping mask 10 at a predetermined scaling factor onto the film in corporation with the imaging lens 11. The objective lens 12 also serves to, for example, capture an image of a reference pattern used as a positioning reference for irradiation with the laser light L, on the transparent reference substrate 21 (see FIG. 2) placed opposite to the metal frame 3 of the mask member 17. Then, the image can be captured by the image pickup camera 14 which is described later. The position of an image formed with the objective lens 12 is in conjugation with the beam-shaping mask 10.

The image pickup camera 14 takes an image of the reference pattern on the reference substrate 21. For example, the camera 14 is a CCD camera or a CMOS camera for capturing a 2D image. The position of an image formed with the objective lens 12 is in conjunction with the image pickup plane of the image pickup camera 14.

The illumination light source 16 is, for example, a halogen lamp for radiating visible light. The source 16 serves to illuminate an image pickup area of the image pickup camera 14 and assist the image pickup camera 14 in taking images.

In FIG. 2, reference numeral 22 indicates an imaging lens for forming an image of the reference pattern on the reference substrate or an image of the opening pattern 4 etc. formed by laser processing onto the image pickup plane of the image pickup camera 14 in corporation with the objective lens 12; reference numeral 23, a relay lens; and 24, a total reflection mirror.

Described next is the step of forming an opening pattern using the thus-configured laser processing device. First, the mask member 17 is aligned with the reference substrate 21 based on an alignment mark (not shown), facing the film of the mask member 17 toward a surface 21*a* opposite to the surface having the reference pattern formed on the reference substrate 21. Following this, the film 20 is brought into close contact with the surface 21*a* of the reference substrate 21.

Subsequently, as shown in FIG. 2, the mask member 17 integrated with the reference substrate 21 is positioned and placed on the XY stage 7 with the mask member 17 facing the laser light L side.

Next, the XY stage 7 is moved to set the objective lens 12 at the start position of laser processing for the mask member 17. To be specific, the image pickup camera 14 takes, through the film 20, an image of the reference pattern formed on the reference substrate 21 corresponding to, for example, the center of a unit area at the start position of laser processing and then positions the reference pattern at the imaging center. The image pickup center coincides with the optical axis of the objective lens 12.

Subsequently, an optical unit of the laser processing device is raised by a predetermined distance along the optical axis of the objective lens 12 in the Z-axis direction to adjust the position of an image formed with the objective lens 12 to the interface between the film 20 of the mask member 17 and the reference substrate 21.

After that, the laser light source 8 is driven to execute pulse oscillation and then emit plural shots of laser beam. The emitted laser beam is expanded by the coupling optical system 9 and homogenized into laser light with uniform intensity distribution and then, irradiated to the beam-shaping mask 10.

After passing through the plural light transmissive windows 18 of the beam-shaping mask 10, the laser light L irradiated to the beam-shaping mask 10 is shaped substantially in conformity with the opening pattern 4 in cross section. Then, the plural beams of laser light L exit the beam-shaping mask 10. Then objective lens 12 condenses the plural beams onto the film 20.

Figure 4A:
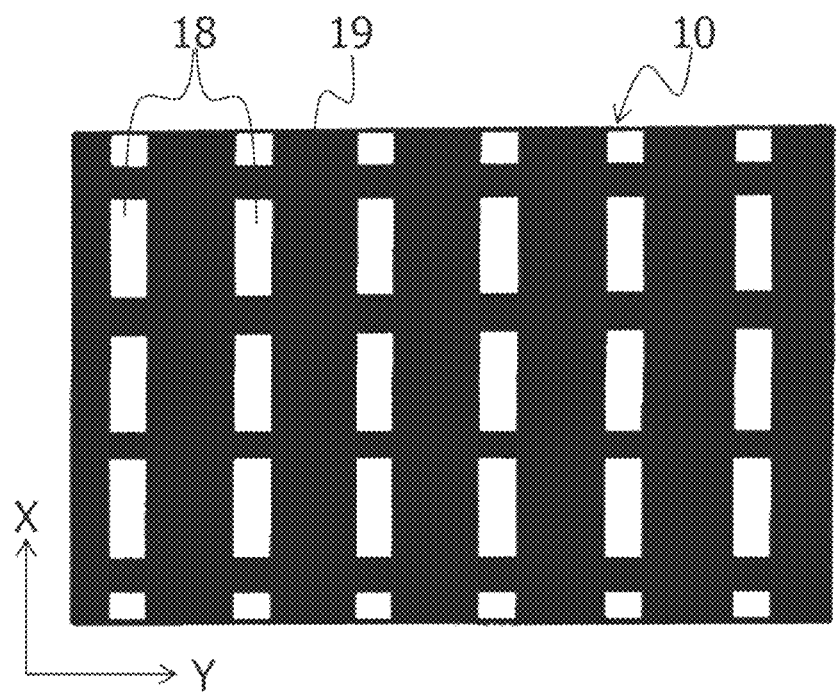
Figure 4B:
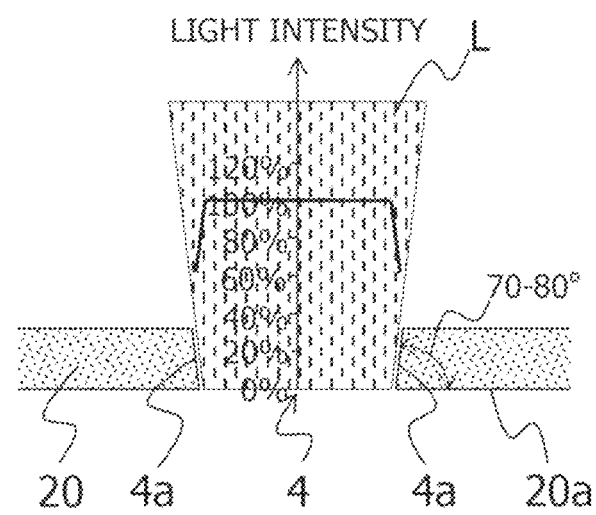

We consider that the laser light L is shaped by the beam-shaping mask 10 that is produced by the conventional technique such that the light shielding film 19 shields light in outer areas of the light transmissive window 18 as shown in FIG. 4A. In this case, the light shows substantially uniform distribution of light intensity in the X- (and Y-) axis direction as indicated by the thick solid line in FIG. 4B. Thus, if the opening pattern 4 is formed in the film 20 by laser processing with the above laser light L, the opposing side walls 4a thereof incline at a wide angle (large angle) of 70° to 80° relative to the film surface (mask surface) 20a opposite to the laser light L side (corresponding to the deposition source side) as shown in FIG. 4B.

On the other hand, according to the present invention, as shown in FIG. 3A, the light transmittance gradually reduces with distance from the edge of the light transmissive window 18 at outer areas on opposing sides of the light transmissive window 18 in the Y-axis direction (corresponding to the longitudinal direction of the through hole 5 of the metal mask 2) as described above. Regarding the intensity distribution of the laser light L passed through the beam-shaping mask 10 in the Y-axis direction, the intensity thus marks the highest at the center corresponding to the opening pattern 4 as indicated by the thick solid line in FIG. 3D and gradually reduces with distance from the portion corresponding to the edge of the opening pattern 4. Accordingly, the opposing side walls 4a of the opening pattern 4 formed in the film 20 by the laser light L have narrow inclination angle (small inclination angle) of 25° to 30° relative to the film surface (mask surface) 20a opposite to the laser light L side (corresponding to the deposition source side) as shown in FIG. 3D.

In this case, as shown in FIG. 3A, there is no gradation of light transmittance at outer areas on opposing sides of the light transmissive window 18 in the X-axis direction. As a result, the light intensity distribution becomes uniform in this direction, and the opposing side walls of the resultant opening pattern 4 in this direction incline at 70° to 80° relative to the film surface 20a opposite to the laser light L side as in the conventional techniques.

After the formation of the plural opening patterns 4 in a unit area at the start position of laser processing, the XY stage 7 is moved stepwise by a predetermined distance in the X- or Y-axis direction. The same applies hereafter. That is, plural opening patterns 4 are sequentially formed in the second unit area, the third unit area, and so on through laser processing. In this way, the plural opening patterns 4 are formed at predetermined positions of the film 20 to produce the film mask 1.

In this case, as described above, the image pickup camera 14 takes an image of the reference pattern formed in the reference substrate 21 corresponding to, for example, the center of the unit area at the start position of laser processing. After confirming the position thereof, the XY stage 7 is moved stepwise in the X- or Y-axis direction with reference to the position of the reference pattern to thereby form the plural opening patterns 4. At this time, the plural opening patterns 4 may be formed in each unit area while the XY stage 7 moves stepwise by the distance that is previously determined based on the mechanical accuracy of the XY stage 7. Besides, the patterns may be formed in a different way. That is, the image pickup camera 14 takes an image of the reference pattern formed in the reference substrate 21 corresponding to the center of each unit area. The reference pattern is then aligned with, for example, the image pickup center of the image pickup camera 14 (conforming to the optical axis of the objective lens 12). After that, the plural opening patterns 4 can be formed by laser processing.

The following is also applicable. That is, the alignment mark on the mask is formed by laser processing in the through hole 25 that is intended for the same (see FIGS. 1A to 1C). After that, the plural opening patterns 4 can be formed in each unit area by moving the XY stage 7 stepwise by a predetermined distance in the X- or Y-axis direction with reference to the alignment mark on the mask.

We discuss next the deposition with the deposition mask of the present invention, focusing on the case where the mask is applied to a vapor-deposition device by way of example. This vapor-deposition device serves to form a deposition pattern while scanning the substrate in one direction.

First, a substrate is placed on a substrate holder movably installed in a vacuum chamber. The deposition mask is further placed on the substrate with the film mask 1 facing toward the substrate. At this time, a camera disposed in the vacuum chamber takes images of the alignment mark on the substrate and the alignment mark on the deposition mask to thereby adjust positions of the substrate and the deposition mask based on a predetermined positional relationship between both the marks. Following this, the magnetic force of a magnet embedded in the substrate holder attracts the metal mask 2 and brings the film mask 1 into close contact onto the deposition surface of the substrate.

The vacuum chamber is then evacuated down to the predetermined degree of vacuum. After that, the substrate holder starts scanning together with the substrate and the deposition mask at a constant speed in a direction (X-axis direction or the direction indicated by arrow A) crossing the longitudinal direction of the through hole 5 of the metal mask 2 constituting the deposition mask. At the same time, a vapor-deposition source 26 (see FIGS. 5A to 7B) is heated and begins to evaporate. For ease of explanation, the vapor-deposition source 26 is located above the deposition mask in FIGS. 5A to 7B. In the actual vapor-deposition device, however, the vapor-deposition source 26 is provided below the deposition mask.

We discuss the general configuration of the vapor-deposition source 26 of the vapor-deposition device that evaporates target substances while scanning the substrate. That is, plural unit vapor-deposition sources 26a are arranged in line along the direction (Y-axis direction) crossing the direction of scanning the substrate (corresponding to the direction in which the vapor-deposition source 26 scans relative to the substrate (hereinafter referred to as "relative scan direction"), that is, the direction indicated by arrow A or the X-axis direction) (see FIG. 5B, for example). A shielding plate is provided on both sides thereof in the relative scan direction of the vapor-deposition source 26 (direction indicated by the arrow A) (see FIG. 5A, for example). As the shielding plate 27 blocks the vapor-deposition substance particles in the relative scan direction, the minimum dispersion angle θt of the particles is limited to about 70° to 80 relative to the opening side of the vapor-deposition source 26 (plane parallel to the mask surface of the opposing deposition mask). On the other hand, no shielding plate 27 is provided in the direction (Y-axis direction) crossing the relative scan direction of each of the unit vapor-deposition sources 26a constituting the vapor-deposition source 26 (see FIG. 5B). Thus, the minimum dispersion angle θe of vapor-deposition substance particles in the Y-axis direction is as small as about 20° to 30° relative to the opening side of the vapor-deposition source 26.

Figure 5A:
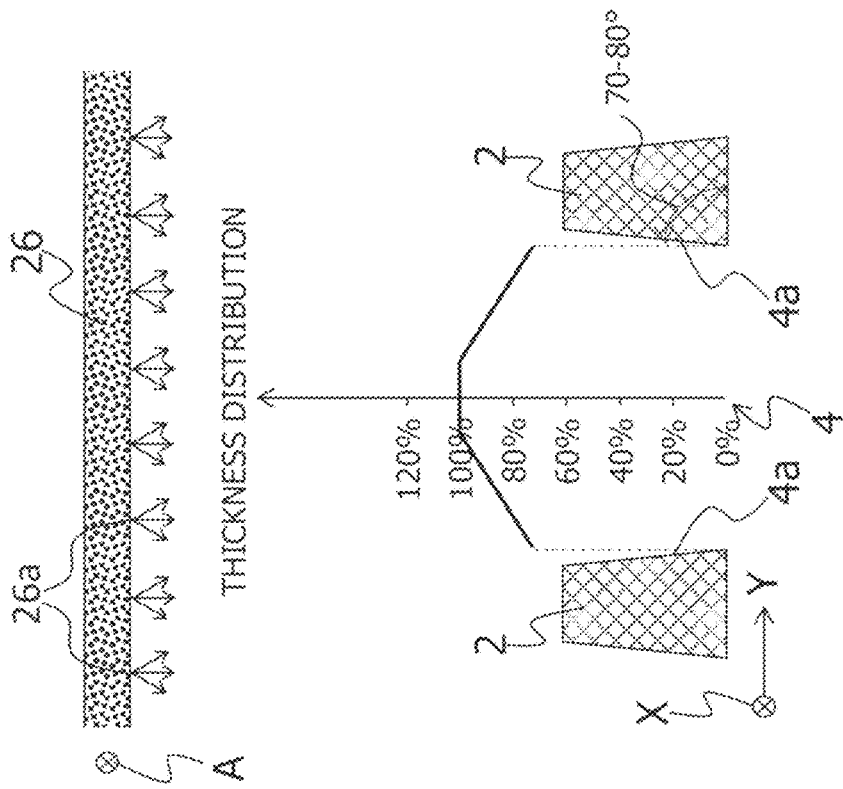

We consider the case of using the deposition mask made up only of the metal mask 2 produced by the conventional technique, which cannot arbitrarily control the inclination angle of side walls of the opening pattern 4. As shown in FIG. 5A, the minimum dispersion angle θt of the vapor-deposition substance particles in the relative scan direction indicated by arrow A is limited to about 70° to 80° Thus, even if the opposing side walls 4a of the opening pattern 4 in this direction incline at a large angle of 70° to 80°, the walls 4a do not shadow the substrate from the vapor-deposition substance in this direction and the thickness distribution of the vapor-deposition layer becomes substantially uniform in this direction.

Figure 5B:
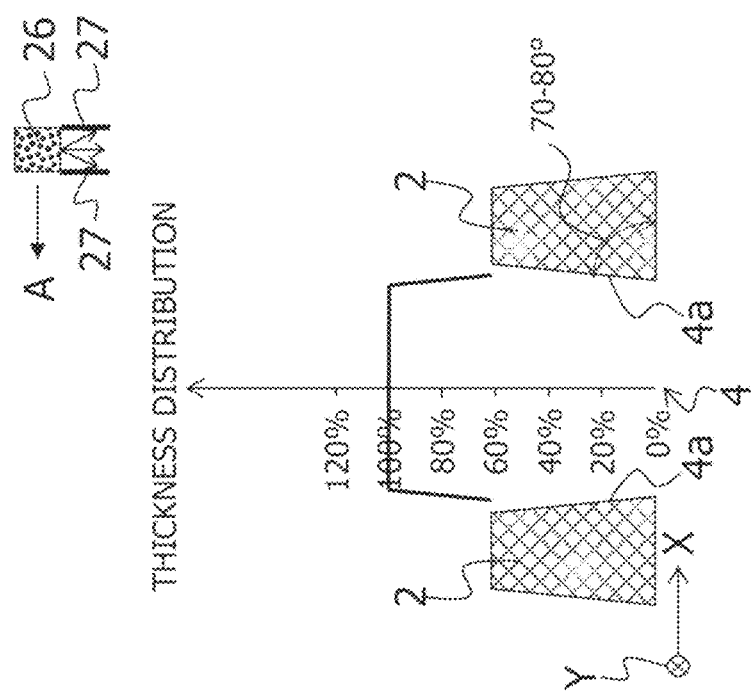

As shown in FIG. 5B, however, there is no limitation on the minimum dispersion angle θe of the vapor-deposition substance particles in the direction (Y-axis direction) crossing the relative scan direction of the vapor-deposition source 26 as indicated by arrow A. Thus, the vapor-deposition substance particles can be incident to the deposition mask at a small angle of about 20° to 30°. Accordingly, the opposing side walls 4a of the opening pattern 4 in this direction shadow the substrate from the vapor-deposition substance particles and the thickness distribution of the vapor-deposition layer becomes non-uniform in this direction. That is, the vapor-deposition layer is thinner at opposite ends in this direction.

Figure 6A:
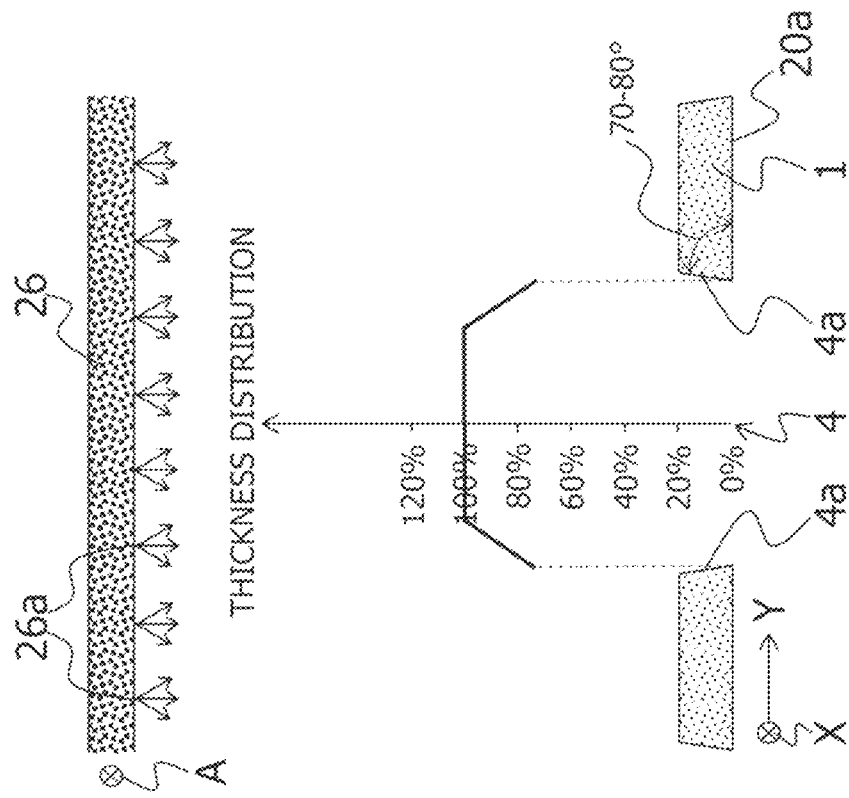

We consider the case of using the deposition mask including the film mask 1 having the opening patterns 4 formed by laser processing with the beam-shaping mask 10 that is produced by the conventional technique as shown in FIG. 4A. The minimum dispersion angle θt of the vapor-deposition substance particles in the relative scan direction of the vapor-deposition source 26 as indicated by arrow A (X-axis direction) is also limited to about 70° to 80 as shown in FIG. 6A. Thus, even if the opposing side walls 4a of the opening pattern 4 in this direction incline at a large angle of 70° to 80°, the walls 4a do not shadow the substrate from vapor-deposition substance particles in this direction and the thickness distribution of the vapor-deposition layer becomes substantially uniform in this direction.

Figure 6B:
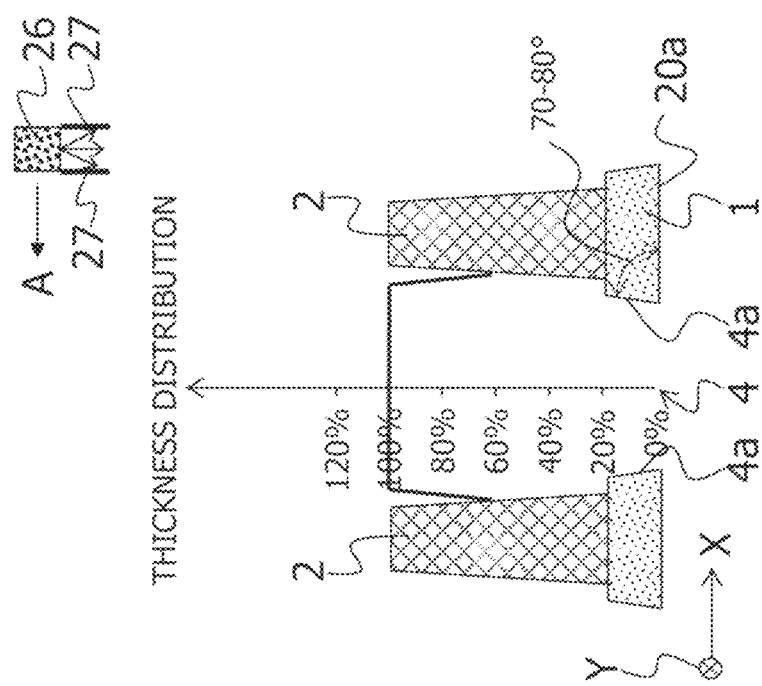

As shown in FIG. 6B, however, there is no limitation on the minimumdispersion angle θe of the vapor-deposition substance particles in the direction (Y-axis direction) crossing the relative scan direction of the vapor-deposition source 26 as indicated by arrow A. Thus, the vapor-deposition substance particles can be incident to the deposition mask at a small angle of about 20° to 30°. Accordingly, the opposing side walls 4a of the opening pattern 4 in this direction shadow the substrate from the vapor-deposition substance particles and the thickness distribution of the vapor-deposition layer becomes non-uniform in this direction. That is, the vapor-deposition layer is thinner at opposite ends in this direction.

Figure 7A:
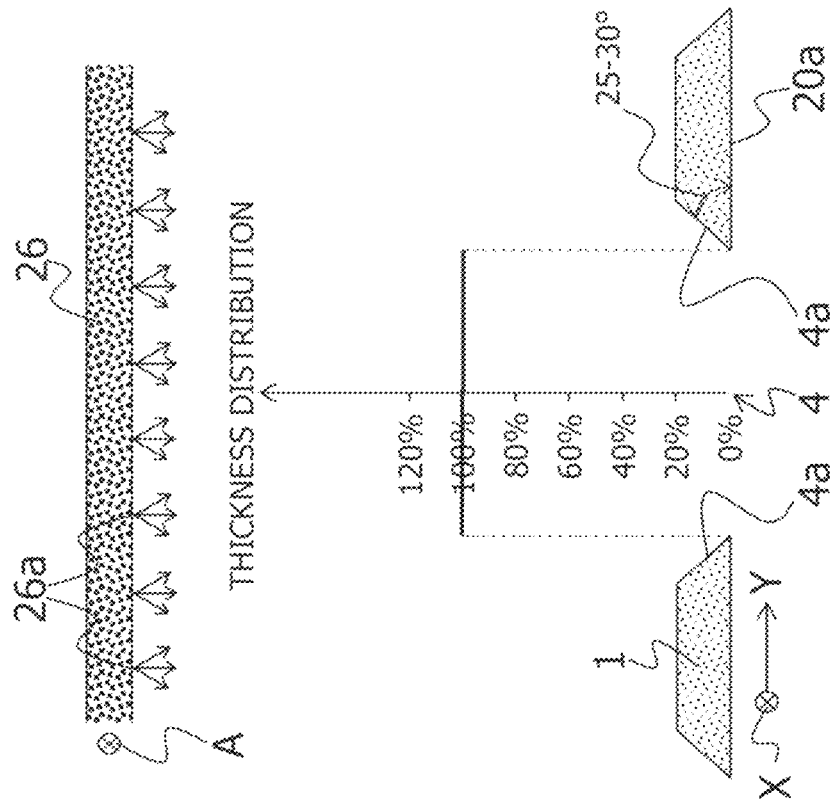

On the other hand, according to the deposition mask of the present invention, as shown in FIG. 7A, the opposing side walls incline at a large angle of 70° to 80° on both sides in the relative scan direction of the vapor-deposition source 26 as indicated by arrow A similar to the conventional deposition mask. However, the minimum dispersion angle θt of the vapor-deposition substance particles in this direction is limited to about 70° to 80°. Therefore, as in the conventional techniques, the opposing side walls 4a of the opening pattern 4 in this direction do not shadow the substrate from the vapor-deposition substance particles and the thickness distribution of the vapor-deposition layer becomes substantially uniform in this direction.

Figure 7B:
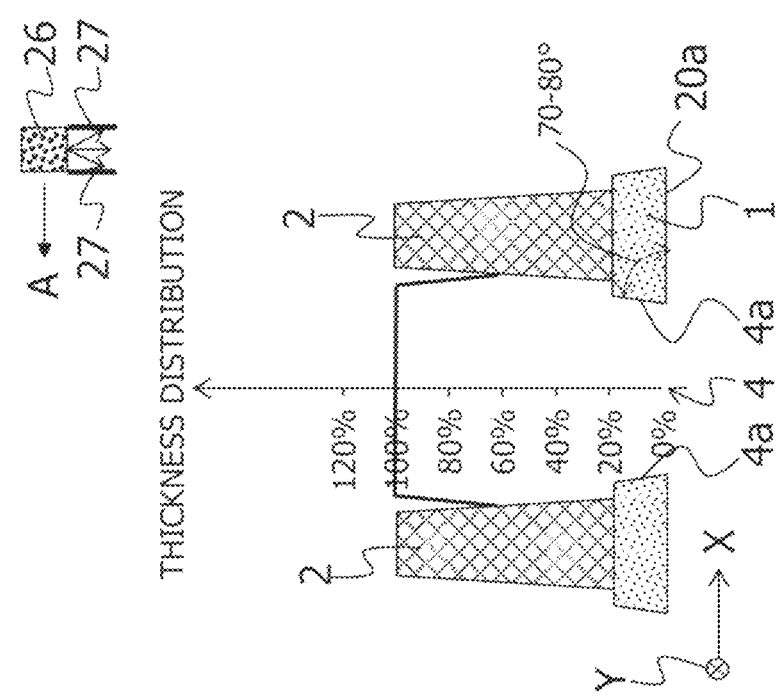

Regarding the inclination angle of the opposing side walls 4a of the opening pattern 4 in the direction crossing the relative scan direction of the vapor-deposition source 26 indicated by arrow A, in the deposition mask according to the present invention, the opposing side walls 4a incline at a small angle of 25° to 30° relative to the film surface 20a opposite to the vapor-deposition source 26 side as shown in FIG. 7B. Therefore, the opposing side walls 4a of the opening pattern 4 in this direction do not shadow the substrate from vapor-deposition substance particles incident to the deposition mask at a small angle of 25° to 30° from the direction (Y-axis direction) crossing the relative scan direction of the vapor-deposition source 26 as indicated by arrow A. Accordingly, the thickness distribution of the vapor-deposition layer becomes substantially uniform in this direction.

Figure 8A:
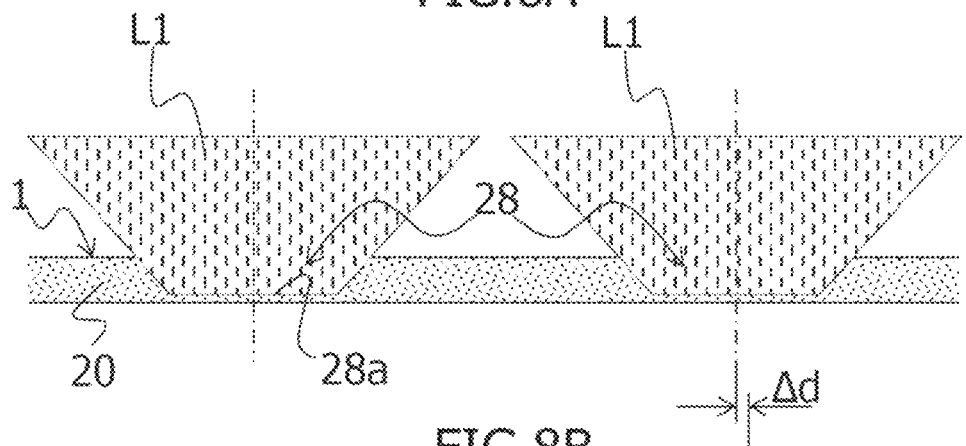
FIGS. 8A to 8C shows steps of laser processing for forming an opening pattern as a modified example in a method for manufacturing a deposition mask according to the present invention.
Figure 8B:
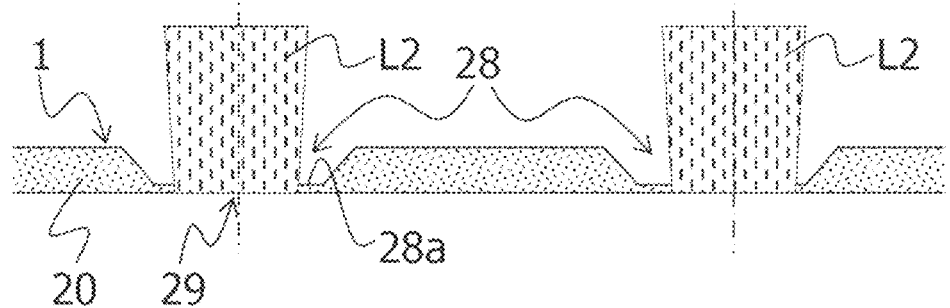
Figure 8C:
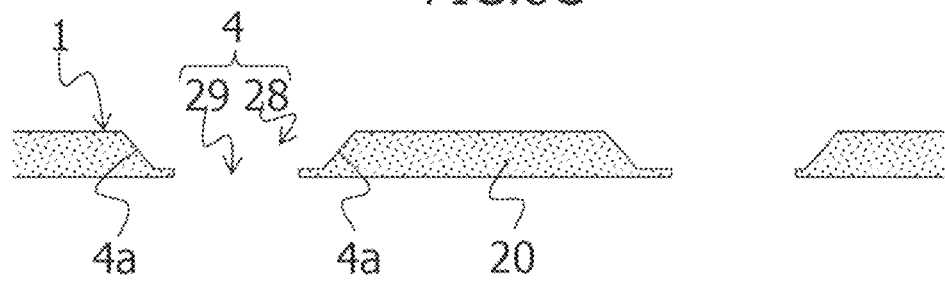

FIGS. 8A to 8C illustrate steps of laser processing for forming the opening pattern 4 as a modified example in a method for manufacturing a deposition mask according to the present invention. First of all, first laser light L1 is obtained by shaping the laser light L using the beam-shaping mask 10 (first beam-shaping mask) having the light transmissive window 18 that allows the laser light L to pass therethrough as shown in FIG. 3A with the light transmittance gradually reducing from the edge on at least one of opposing sides of the light transmissive window 18 at outer areas thereof. Then, the first laser light L1 is irradiated to a target area of the film 20 corresponding to an area assigned to the opening pattern to thereby form a recess 28 at a predetermined depth as shown in FIG. 8A.

Subsequently, second laser light L2 is obtained by shaping the laser light L using the beam-shaping mask 10 (second beam-shaping mask) having the light transmissive window 18 of a shape similar to the opening pattern 4 and light shielding areas formed outside the light transmissive window 18 as shown FIG. 4A. Then, the second laser light L2 is irradiated to a target area corresponding to an area assigned to the opening pattern 4 at the bottom 28a of the recess 28 as shown in FIG. 8B to thereby form a through hole 29. In this way, as shown in FIG. 8C, it is possible to form the opening pattern 4 with at least one pair of opposing side walls 4a that open wide toward the laser light L side at least on the surface of the film 20 on the laser light L side.

In this case, as shown in FIG. 8C, if the light transmissive window 18 of the first beam-shaping mask 10 is formed so that the bottom area of the recess 28 becomes wider than the opening area of the through hole 29, even when the irradiation position of the first laser light L1 is shifted by Δd from the predetermined position, the through hole 29 can be formed in the predetermined position within the recess 28 (see FIGS. 8A and 8B). Therefore, the positioning accuracy for the recess 28 may be lower than that of the through hole 29.

In the above embodiments, described is the deposition mask having a laminate of the film mask 1 and the metal mask 2 being fixed to the frame. However, the present invention is not limited thereto. The frame can be omitted. The film mask 1 may be provided alone. The film mask 1 may be fixed to the frame.

Further, in the above embodiment, the deposition mask is applied to the vapor-deposition device, but the present invention is not limited thereto. The mask is applicable to a spattering device or other deposition devices.

Those skilled in the art can made various substitutions, modifications, and changes on the present invention within the technical scope of the present invention, and the scope of the present invention should not be limited by the aforementioned embodiments and the accompanying drawings.

It should be noted that the entire contents of Japanese Patent Application No. 2013-264326, filed on Dec. 20, 2013, on which convention priority is claimed, is incorporated herein by reference.

It should also be understood that many modifications and variations of the described embodiments of the invention will be apparent to a person having an ordinary skill in the art without departing from the spirit and scope of the present invention as claimed in the appended claims.

What is claimed is:

1. A method for manufacturing a deposition mask, comprising a step of irradiating, on a resin film, laser light that is shaped using a first beam-shaping mask having a first light transmissive window that allows the laser light to pass therethrough with light transmittance gradually reducing with distance from an edge of the first light transmissive window on at least one of opposing sides of the first light transmissive window within an area outside the first light transmissive window to thereby form an opening pattern having a polygonal shape in a plan view having at least one pair of opposing side walls that are inclined to open wide toward a surface to be irradiated with the laser light, wherein the opening pattern is formed by performing a step of irradiating first laser light shaped by the first beam-shaping mask to form a recess at a predetermined depth in an area assigned to the opening pattern on the resin film and a step of irradiating, on a resin film inside the recess, second laser light shaped by a second shaping mask having a second light transmissive window of a shape similar to the opening pattern and a light shielding portion formed outside the second light transmissive window to thereby form a through hole penetrating the resin film.

2. The method for manufacturing a deposition mask according to claim 1, wherein the opening pattern has a plurality of pairs of opposing side walls that incline at different angles at least at the surface to be irradiated with the laser light.

3. The method for manufacturing a deposition mask according to claim 1, wherein the bottom area of the recess is wider than an opening area of the through hole.

4. The method for manufacturing a deposition mask according to claim 1, wherein a metal mask is laminated on the surface of the resin film to be irradiated with the laser light, and the metal mask has a through hole capable of accommodating the opening pattern.

5. The method for manufacturing a deposition mask according to claim 4, wherein a laminate of the resin film and the metal mask is stretched over one end surface of a frame and held thereto prior to formation of the opening pattern.

* * * * *